United States Patent
Doan

[19]

[11] Patent Number: 6,111,744
[45] Date of Patent: Aug. 29, 2000

[54] CAPACITOR CONSTRUCTIONS HAVING SILICON NITRIDE DIELECTRIC MATERIALS

[75] Inventor: Trung Tri Doan, Boise, Id.

[73] Assignee: Micron Technology, Inc., Boise, Id.

[21] Appl. No.: 09/079,317

[22] Filed: May 14, 1998

Related U.S. Application Data

[62] Division of application No. 08/967,766, Nov. 10, 1997.

[51] Int. Cl.[7] .............................. H01G 4/06; H01G 4/10; H01G 4/12
[52] U.S. Cl. ...................... 361/311; 361/321.5; 361/322; 438/239; 438/251; 257/310
[58] Field of Search ........................ 361/311–313, 321.2, 361/321.3, 321.4, 321.5, 322; 29/25.41, 25.42; 257/295, 310, 306, 532, 324; 438/240, 239, 250, 253, 763

[56] References Cited

U.S. PATENT DOCUMENTS

| | | | |
|---|---|---|---|
| 4,254,161 | 3/1981 | Kemlage | 427/94 |
| 4,882,649 | 11/1989 | Chen et al. | 361/313 |
| 4,891,684 | 1/1990 | Nishioka et al. | 361/313 |
| 4,996,081 | 2/1991 | Ellul et al. | 427/96 |
| 5,051,794 | 9/1991 | Mori | 257/316 |
| 5,142,438 | 8/1992 | Reinberg et al. | 361/313 |
| 5,324,679 | 6/1994 | Kim et al. | 438/386 |
| 5,376,593 | 12/1994 | Sandhu et al. | 438/762 |
| 5,498,890 | 3/1996 | Kim et al. | 257/310 |
| 5,504,029 | 4/1996 | Murata et al. | 257/296 |
| 5,508,542 | 4/1996 | Geiss et al. | 257/301 |
| 5,523,596 | 6/1996 | Ohi et al. | 257/296 |
| 5,731,235 | 3/1998 | Srinivasan et al. | 438/253 |
| 5,844,771 | 12/1998 | Graettinger et al. | 361/303 |
| 5,851,603 | 12/1998 | Tsai et al. | 427/579 |
| 6,001,718 | 12/1999 | Tanaka et al. | 438/791 |

*Primary Examiner*—Kristine Kincaid
*Assistant Examiner*—Anthony Dinkins
*Attorney, Agent, or Firm*—Wells, St. John, Roberts, Gregory & Matkin

[57] ABSTRACT

The invention includes a capacitor. The capacitor has a first conductive capacitor electrode, a second conductive capacitor electrode, and a capacitor dielectric material intermediate the first and second capacitor electrodes. The dielectric material contacts both of the first and second capacitor electrodes. All of the dielectric material intermediate the first and second capacitor plates consists of silicon nitride.

6 Claims, 3 Drawing Sheets

CAPACITOR CONSTRUCTIONS HAVING SILICON NITRIDE DIELECTRIC MATERIALS

RELATED PATENT DATA

This patent resulted from a divisional application of U.S. patent application Ser. No. 08/967,766, which was filed on Nov. 10, 1997 and is now pending.

TECHNICAL FIELD

This invention pertains to methods of forming silicon nitride layers on silicon-comprising substrate surfaces, to methods of densifying silicon nitride layers, to methods of forming capacitors, and to capacitor constructions.

BACKGROUND OF THE INVENTION

Capacitors are commonly-used electrical components of semiconductor circuitry. A typical capacitor construction comprises a first conductive plate and a second conductive plate, with a dielectric material between and separating the conductive plates. A typical dielectric material used in capacitor constructions comprises three layers, with a first layer being a silicon dioxide layer, a second layer being a silicon nitride layer, and a third layer being another silicon dioxide layer, with the silicon nitride layer being between the silicon dioxide layers. As silicon nitride has a higher dielectric constant than silicon dioxide, it would be desirable to eliminate one or both of the silicon dioxide layers from capacitor dielectric material.

A prior art method of forming a capacitor is described with reference to FIGS. 1 and 2. Referring first to FIG. 1, a semiconductive wafer fragment 10 is shown at a preliminary step of a prior art processing sequence. Wafer fragment 10 comprises a semiconductive substrate 12 and a first capacitor plate layer 14 overlying substrate 12. Substrate 12 comprises a lightly doped monocrystalline silicon material. First capacitor plate layer 14 typically comprises conductively doped polysilicon. As will be recognized by persons of ordinary skill in the art, first capacitor plate layer 14 need not be formed in direct physical contact with a semiconductive substrate 12.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An oxide layer 16 is formed over first capacitor plate layer 14. Oxide layer 16 is typically native oxide which naturally forms over a polysilicon layer 14 upon exposure to an oxygen-comprising atmosphere.

A silicon nitride layer 18 is formed over silicon oxide layer 16. Silicon nitride layer 18 is commonly formed by chemical vapor deposition and may be formed, for example, utilizing dichlorosilane and ammonia at a pressure of 500 milliTorr and a temperature of 680° C. Silicon nitride layer 18 commonly has a number of pinholes, or pits, 20 extending partially into or through silicon nitride layer 18. Such pits are undesirable as they, if left unfilled, would permit shorting between an outer conductive plate 24 (shown in FIG. 2 and discussed below) and inner conductive plate 14. Accordingly, pits 20 are typically filled.

Referring to FIG. 2, a layer of silicon dioxide 22 is formed over silicon nitride layer 18 and within pits 20 to fill pits 20. Silicon oxide layer 22 is commonly formed by exposing wafer fragment 10 to a wet oxidizing atmosphere at about 850° C.

After formation of silicon oxide layer 22, a second, or outer, conductive plate layer 24 is formed over oxide layer 22 to complete formation of a capacitor structure 30. At least one of capacitor plate layers 14 or 24 is electrically connected to a circuit external of capacitor 30 for charging and discharging capacitor 30.

Another aspect of the prior art pertains to nitridation of silicon surfaces. Such nitridation is commonly utilized to form an insulative layer over silicon services for electrically isolating components of a semiconductor circuit from one another. A prior art nitridation method is described with reference to a wafer fragment 40 in FIG. 3. Wafer fragment 40 comprises a substrate 42, a silicon-comprising conductive layer 44 overlying substrate 42, and a silicon nitride layer 48 overlying conductive layer 44. Substrate 42 may comprise, for example, a lightly doped monocrystalline silicon wafer. Conductive layer 44 may comprise, for example, conductively doped polysilicon. Also, although not shown, an oxide layer may be formed between conductive layer 44 and nitride layer 48 if, for example, conductive layer 44 comprises polysilicon and is exposed to oxygen prior to formation of silicon nitride layer 48.

Silicon nitride layer 48 is formed by exposing a surface of silicon-comprising layer 44 to ammonia at a pressure of less than or equal to one atmosphere and at a temperature of about 1000° C. Such process is self-limiting due to poor diffusion of the nitrogen species through the initially formed layer of silicon nitride ($Si_3N_4$). The maximum silicon nitride layer thickness that can be achieved with such process is 35 Angstroms.

SUMMARY OF THE INVENTION

The invention encompasses methods of forming capacitors, methods of forming silicon nitride layers on silicon-comprising substrates, methods for densifying silicon nitride layers, methods for forming capacitors, and capacitors.

In one aspect, the invention encompasses a method of forming a silicon nitride layer on a silicon-comprising substrate surface wherein the substrate surface is exposed to a nitrogen-comprising ambient having at least about two atmospheres of pressure.

In another aspect, the invention encompasses a method of densifying a silicon nitride layer wherein the silicon nitride layer is subjected to a nitrogen-comprising ambient having at least about two atmospheres of pressure.

In another aspect, the invention encompasses a method of forming a silicon nitride layer on a silicon-comprising substrate surface. The silicon-comprising substrate surface is exposed to a nitrogen-comprising ambient atmosphere having at least about 2 atmospheres of pressure and comprising at least one of $N_2$, $NH_3$ or $NO_x$. A temperature of the substrate surface is maintained at less than about 1000° C. during exposure of the substrate surface to the nitrogen-comprising ambient atmosphere. The exposure of the substrate surface to the nitrogen-comprising atmosphere is continued for a time period sufficient to form the silicon nitride layer to a thickness of at least about 20 Angstroms, and preferably to at least about 40 Angstroms.

In another aspect, the invention encompasses a method of forming a capacitor. A first capacitor plate is formed, and a dielectric layer is formed proximate the first capacitor plate. The forming of the dielectric layer includes chemical vapor depositing silicon nitride over a surface of the first capacitor plate surface to form a silicon nitride layer. The silicon nitride layer is exposed to a nitrogen-comprising ambient atmosphere having at least about 2 atmospheres of pressure and comprising at least one of $N_2$, $NH_3$ or $NO_x$. A second capacitor plate is formed over the dielectric layer capacitor plate.

In another aspect, the invention encompasses a capacitor. The capacitor includes a first conductive capacitor plate, a second conductive capacitor plate; and capacitor dielectric material intermediate the first and second capacitor plates. All of the dielectric material intermediate the first and second capacitor plates consists essentially of a single oxide layer and a single nitride layer.

In another aspect, the invention encompasses a capacitor. The capacitor includes a first conductive capacitor plate, a second conductive capacitor plate; and a dielectric layer intermediate the first and second capacitor plates. All of the dielectric material intermediate the first and second capacitor plates consists essentially of silicon nitride and has a thickness of at least about 20 Angstroms.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention encompasses methods of forming dielectric layers, and methods of incorporating such dielectric layers into capacitor constructions. A first embodiment of a method of the present invention is described with reference to FIGS. 4 and 5.

Figure 4:
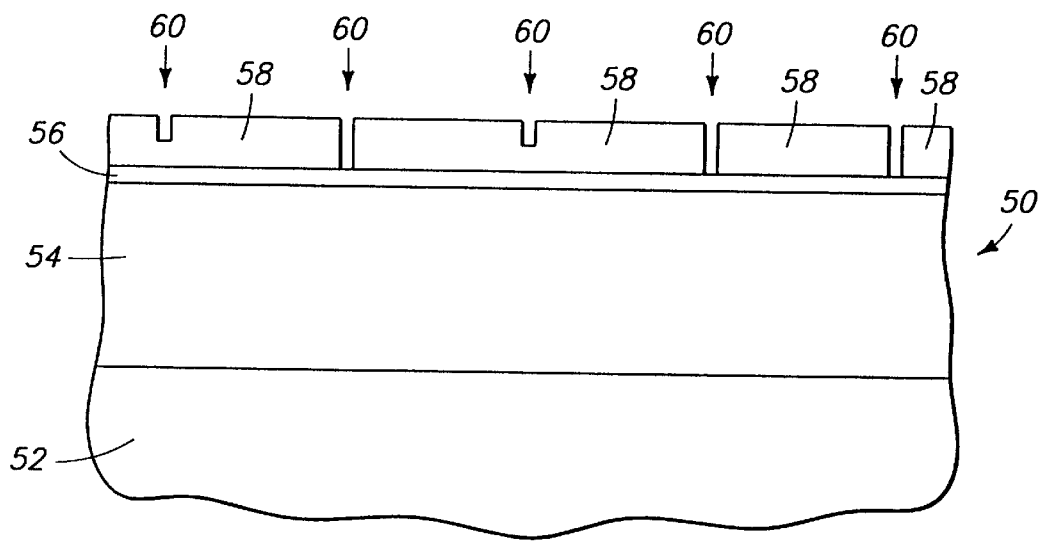
FIG. 4 is a diagrammatic cross-sectional view of a semiconductor wafer fragment at a preliminary step of a method of the present invention.

Referring to FIG. 4, a semiconductive wafer fragment 50 is illustrated at a preliminary processing step of a method of the present invention. Wafer fragment 50 is identical to prior art wafer fragment 10, which was discussed above in the "Background" section of the present invention, and can be formed by identical methods as discussed above.

Figure 1:
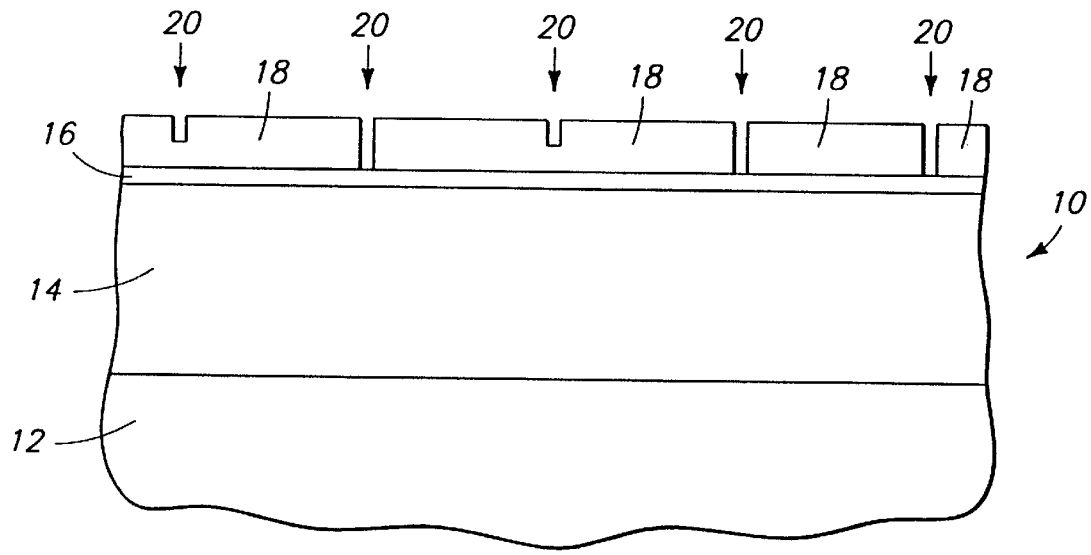
FIG. 1 is a diagrammatic cross-sectional view of a semiconductor wafer fragment at a preliminary step of a prior art processing sequence.

Wafer fragment 50 comprises a substrate 52, a first capacitor plate layer 54 overlying substrate 52, a silicon dioxide layer 56 overlying first capacitor plate layer 54, and a silicon nitride layer 58 formed over silicon dioxide layer 56. Pits 60 extend into and through silicon nitride layer 58. As discussed above with reference to FIG. 1, a pitted silicon nitride layer can be disadvantageously formed, for example, during chemical vapor depositing of a silicon nitride layer, such as layer 58, onto a substrate.

Figure 5:
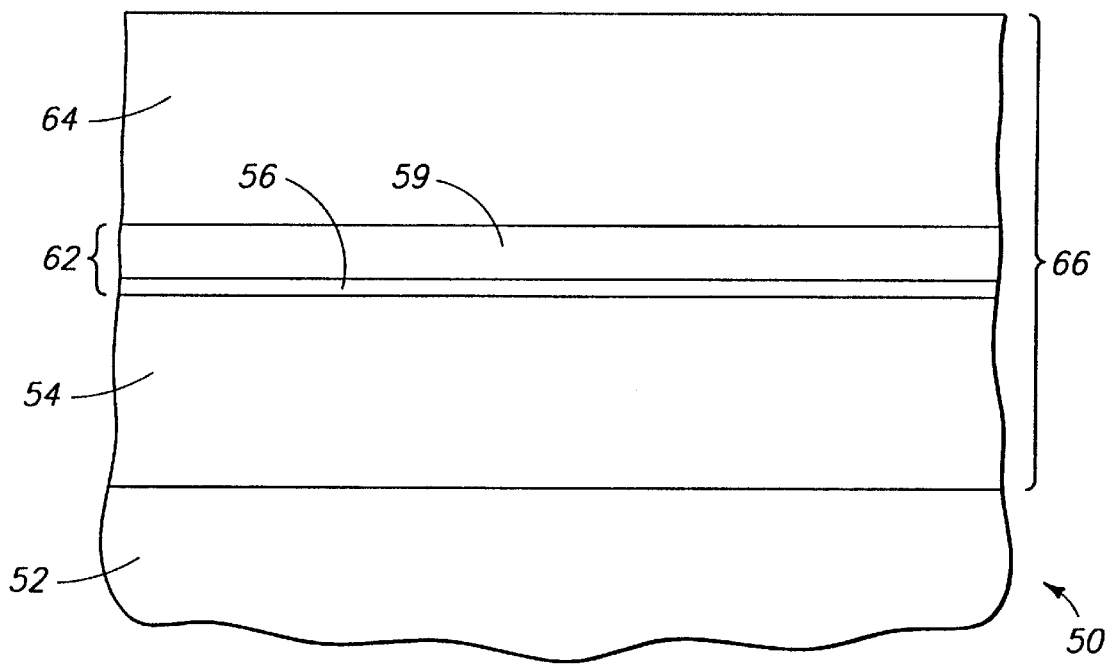
FIG. 5 is a view of the FIG. 4 wafer fragment at a processing step subsequent to that of FIG. 4.

Referring to FIG. 5, wafer fragment 50 is exposed to a nitrogen-comprising ambient atmosphere having at least two atmospheres of pressure. The nitrogen-comprising ambient can comprise $N_2$, but preferably comprises a nitrogen component consisting essentially of one or more nitrogen compounds having elemental nitrogen and at least one element other than nitrogen. More preferably, the nitrogen-comprising ambient comprises at least one of $NH_3$ or $NO_x$. Exposure to the nitrogen-comprising ambient fills pits 60 and thereby densifies silicon nitride layer 58 (shown in FIG. 4). It is noted that some pits 60 (shown in FIG. 4) which extended entirely through nitride layer 58 exposed portions of a silicon-comprising substrate beneath silicon nitride so layer 58. In FIG. 4, such silicon-comprising substrate comprises silicon dioxide layer 56. However, as will be recognized by persons of ordinary skill in the art, a silicon nitride layer, such as layer 58, could be formed over other silicon-comprising substrates besides silicon dioxide layers. Both pitted silicon nitride layer 58 and the exposed portions of the silicon-comprising substrate are subjected to the nitrogen-comprising ambient atmosphere as wafer fragment 50 is exposed to the nitrogen-comprising ambient atmosphere.

After exposure to the nitrogen-comprising atmosphere, silicon nitride layer 58 (shown in FIG. 4) is converted to a silicon nitride layer 59, which is densified and thickened relative to silicon nitride layer 58.

The nitrogen-comprising ambient atmosphere described above may comprise $N_2$, $NH_3$, $NO_x$, or mixtures of two or more of $N_2$, $NH_3$ and $NO_x$. Further, the nitrogen-comprising atmosphere may consist essentially of a gas selected from the group consisting of $N_2$, $NH_3$, $NO_x$ and mixtures thereof.

As discussed above, during exposure of wafer fragment 50 to the nitrogen-comprising ambient atmosphere, the atmosphere will have at least two atmospheres of pressure. Preferably, the atmosphere will have at least about ten atmospheres of pressure, and more preferably, at least about 20 atmospheres of pressure. Portions of wafer fragment 50 exposed to the nitrogen-comprising atmosphere will preferably be maintained at a temperature at least about 500° C. during such exposure, more preferably at a temperature of less than 1000° C., and most preferably at a temperature of from about 800° C. to about 1000° C.

Silicon nitride layer 59 and silicon dioxide layer 56 together form a capacitor dielectric layer 62 proximate conductive plate 54. A second capacitor plate 64 is formed over dielectric layer 62, and operatively proximate dielectric layer 62. Second capacitor plate 64 may comprise, for example, conductively doped polysilicon. Capacitor plates 54 and 64, and dielectric layer 62, together form a capacitor construction 66. One or both of the capacitor plates 54 or 64 is electrically connected to a circuit external of capacitor 66.

Figure 2:
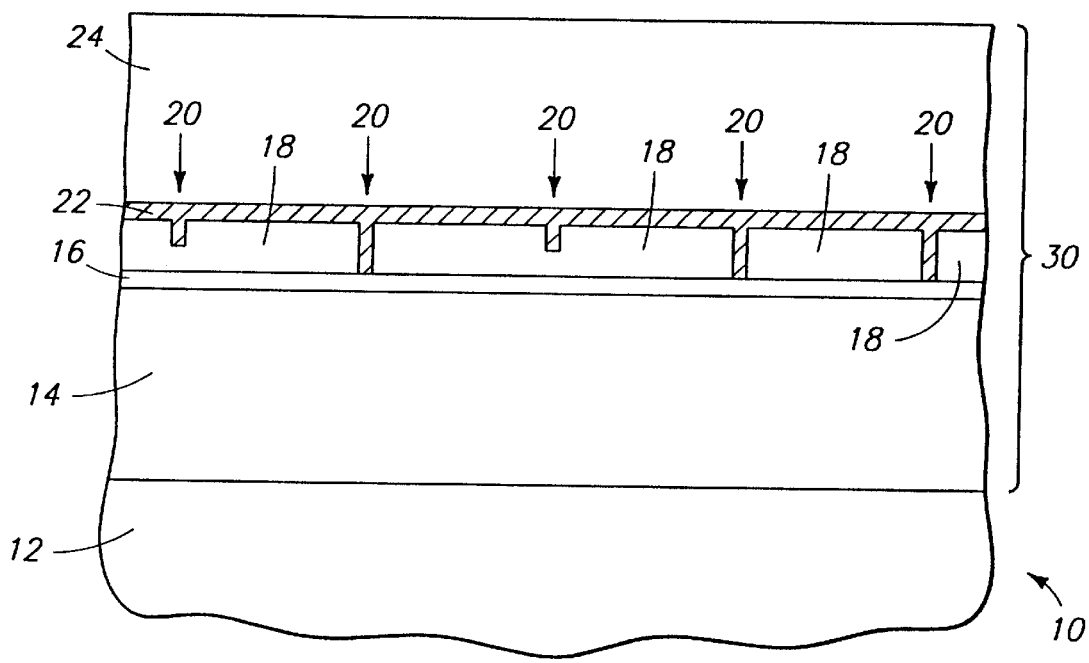
FIG. 2 is a view of the FIG. 1 wafer fragment at a step subsequent to FIG. 1.

Capacitor 66 differs from prior art capacitor 30 (shown in FIG. 2) at least in that capacitor 66 comprises a dielectric layer 62 consisting essentially of a single oxide layer 56 and a single nitride layer 59, whereas capacitor 30 comprises a dielectric layer consisting of two oxide layers 16 and 22, and a nitride layer 18.

It is noted that, although silicon nitride layer 58 is shown formed over a silicon dioxide layer 56, in alternative methods of the invention silicon dioxide layer 56 could be removed prior to forming silicon nitride layer 58. In such embodiments, silicon nitride layer 58 could be formed directly against first capacitor plate layer 54. Methods for removing silicon dioxide layer 56 are known to persons of ordinary skill in the art, and comprise, for example, an in situ oxide clean utilizing HF.

Figure 6:
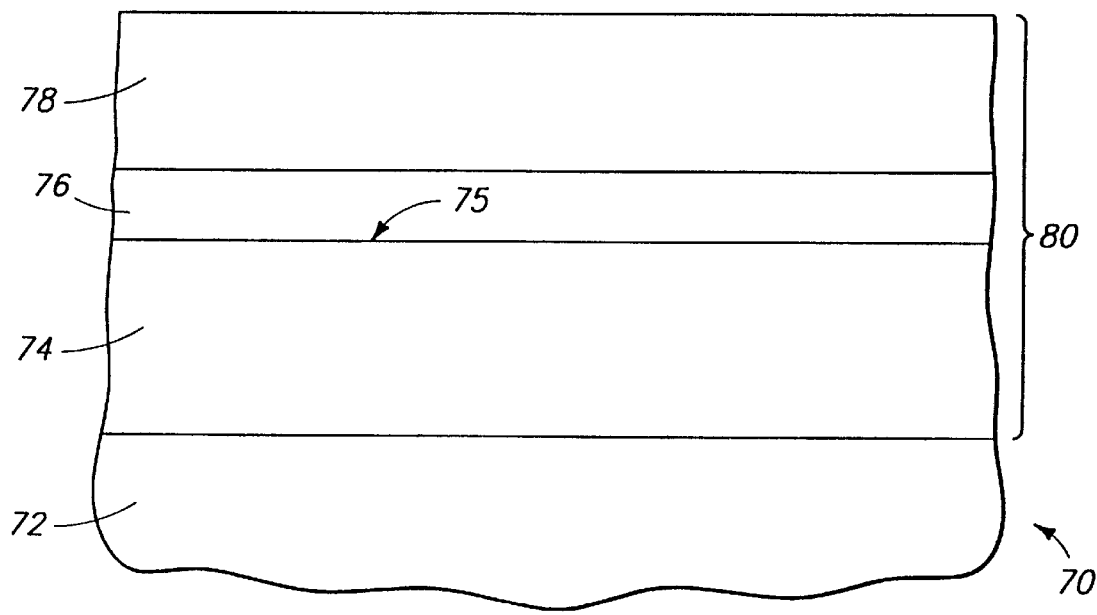
FIG. 6 is a diagrammatic cross-sectional view of a semiconductive wafer fragment formed according to a second method of the present invention.

A second embodiment of the present invention is described with reference to a wafer fragment 70 in FIG. 6. Referring to FIG. 6, wafer fragment 70 comprises a substrate 72, a first capacitor plate 74 overlying substrate 72, a silicon nitride layer 76 overlying first capacitor plate layer 74, and a second capacitor plate layer 78 overlying silicon nitride layer 76.

First capacitor plate 74 and second capacitor plate 78 can comprise, for example, conductively doped polysilicon. Preferably, capacitor plate 74 will be formed of a silicon-comprising material.

Although not shown, a silicon dioxide layer could be formed between layers 74 and 76, particularly if layer 74 is exposed to oxygen prior to formation of silicon nitride layer 76. However, even if capacitor plate 74 is exposed to oxygen prior to formation of silicon nitride layer 76, any silicon dioxide which is formed can be removed with an in situ oxide clean utilizing HF. Preferably, there will be no silicon dioxide layer between capacitor plate 74 and silicon nitride layer 76. The advantages of eliminating silicon dioxide from a dielectric layer are discussed below.

Capacitor plate 74 may be formed by conventional methods. For instance, if capacitor plate 74 is a conductively doped polysilicon layer, capacitor plate 74 may be formed by chemical vapor deposition of polysilicon and either subsequent doping, or in situ doping.

Silicon nitride layer 76 is formed over silicon-comprising capacitor plate 74 by exposing an outer surface 75 of capacitor plate 74 to a nitrogen-comprising ambient atmosphere having at least about two atmospheres of pressure. Preferably, the nitrogen-comprising ambient atmosphere will have a pressure of at least about ten atmospheres, and most preferably will have a pressure of at least about 20 atmospheres. The nitrogen-comprising ambient atmosphere will preferably comprise at least one of the gases $N_2$, $NH_3$ or $NO_x$. Accordingly, the nitrogen-comprising ambient atmosphere may comprise $N_2$, $NH_3$, $NO_x$, or a mixture of two or more of $N_2$, $NH_3$ and $NO_x$. Further, the nitrogen-comprising ambient atmosphere may consist essentially of a gas selected from the group consisting of $N_2$, $NH_3$, $NO_x$, and mixtures thereof.

Surface 75 of silicon-comprising plate 74 will preferably be maintained at a temperature of at least about 500° C. during exposure of surface 75 to the nitrogen-comprising ambient atmosphere; more preferably will be maintained at a temperature of no more than about 1000° C. during such exposure; and most preferably will be maintained at a temperature of from about 800° C. to about 1000° C. during such exposure. Exposure of surface 75 to the nitrogen-comprising ambient atmosphere under the conditions described above forms a silicon nitride layer 76 over surface 75. The formation of silicon nitride layer 76 is a self-limiting event for a given set of processing temperatures, pressures and gas flows. Accordingly, after a few hours layer 76 has reached a maximum thickness from which it will grow little, if any, if exposed for longer time periods. The thickness of layer 76 is found to be a function of the pressure of the nitrogen-comprising ambient atmosphere. At pressures of at least about two atmospheres, silicon nitride layer 76 can be formed to a thickness of at least about 40 Angstroms. At higher pressures, silicon nitride layer 76 can be formed to greater thicknesses.

Figure 3:
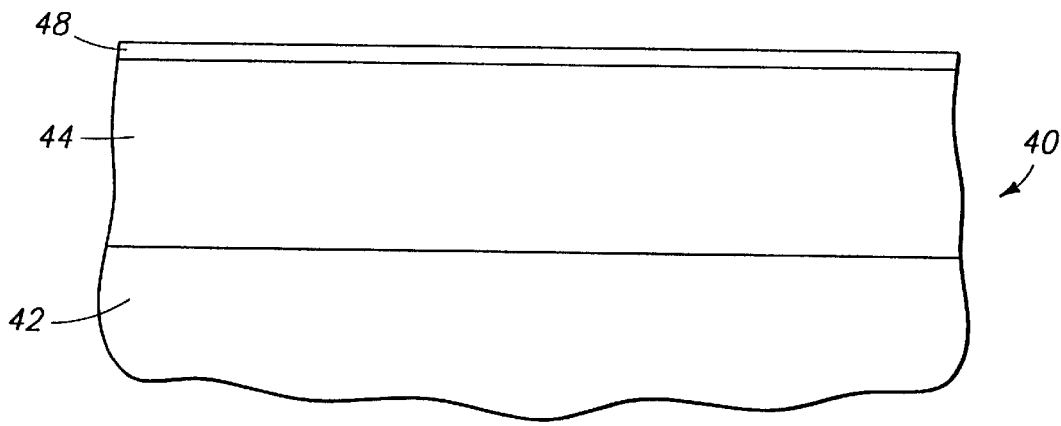
FIG. 3 is a diagrammatic cross-sectional view of a prior art semiconductor wafer fragment.

Capacitor plate layers 74 and 78, and silicon nitride layer 76, together form a capacitor construction 80. Capacitor 80 differs from is the prior art capacitor 30 (described above with reference to FIG. 2) at least in that capacitor 80 comprises a dielectric layer consisting essentially of silicon nitride. Silicon nitride layer 76 differs from the prior art silicon nitride layer 48 (described above with reference to FIG. 3) in that layer 76 is formed to a thickness of at least about 40 Angstroms. As discussed above with reference to FIG. 3, prior art silicon nitride layers are grown to thicknesses of no greater than 35 Angstroms.

Capacitor 80 is completed by electrically connecting one of the capacitor plates 74 or 78 to a circuit external of capacitor 80.

The capacitor constructions 66 and 80 described above with reference to FIGS. 5 and 6 can be advantageous over prior art capacitor 30 (described above with reference to FIG. 2) at least for the reason that capacitors 66 and 80 can comprise dielectric layers having a higher ratio of silicon nitride to silicon dioxide than the prior art capacitor 30. Silicon dioxide has a lower dielectric constant than silicon nitride. Accordingly, a dielectric layer with relatively more silicon dioxide will need to be thicker to obtain a given capacitance than a dielectric layer with relatively less silicon dioxide. As a common goal in forming semiconductive components, such as capacitors, is to minimize a size of such components, the replacement of one or more silicon dioxide layers with silicon nitride is a significant improvement over the prior art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A capacitor comprising:

a first conductive capacitor electrode and a second conductive capacitor electrode; and a capacitor dielectric material intermediate the first and second capacitor electrodes and contacting both of the first and second capacitor electrodes, the dielectric material intermediate the first and second capacitor electrodes consisting essentially of silicon nitride.

2. A capacitor comprising:

a first conductive capacitor electrode and a second conductive capacitor electrode; and a capacitor dielectric material intermediate the first and second capacitor electrodes and contacting both of the first and second capacitor electrodes, the dielectric material intermediate the first and second capacitor electrodes consisting essentially of silicon nitride and having a thickness of at least about 20 Angstroms.

3. The capacitor of claim 2 wherein the dielectric material has a thickness of at least about 40 Angstroms.

4. A capacitor consisting essentially of:

a first conductive capacitor electrode, a second conductive capacitor electrode, and only one dielectric region between the first and second electrodes; and the only one capacitor dielectric region consisting essentially of a single oxide layer and a single nitride layer.

5. A capacitor comprising:

a first conductive capacitor electrode, a second conductive capacitor electrode, and only one capacitor dielectric region between the first and second capacitor electrodes, said only one dielectric region consisting essentially of silicon nitride.

6. A capacitor consisting essentially of:

a first conductive capacitor electrode, a second conductive capacitor electrode, and a single capacitor dielectric material intermediate the first and second capacitor electrodes, said single dielectric material consisting essentially of silicon nitride.

* * * * *

UNITED STATES PATENT AND TRADEMARK OFFICE
CERTIFICATE OF CORRECTION

PATENT NO.   : 6,111,744
DATED        : August 29, 2000
INVENTOR(S)  : Trung Tri Doan Page 1 of 1

It is certified that error appears in the above-identified patent and that said Letters Patent is hereby corrected as shown below:

Column 4,
Line 19, replace "silicon nitride so" with -- silicon nitride --.

Column 6,
Line 6, replace "from is the" with -- from the --.
Line 49, replace "the dielectric" with -- all of the dielectric --.
Line 51, delete the word "essentially".
Line 57, replace "the dielectric" with -- all of the dielectric --.
Line 60, replace "consisting essentially of" with -- consisting of -- .
Line 64, replace "consisting essentially of" with -- comprising --.

Column 7,
Line 1, replace "consisting essentially" with -- consisting --.
Line 7, replace "electrodes, said" with -- electrodes, all of said --.
Line 8, replace "essentially of silicon" with -- of silicon --.

Column 8,
Line 1, replace "consisting essentially of" with -- consisting of --.
Line 5, replace "electrodes, said" with -- electrodes, all of said --.
Line 6, delete the word "essentially".

Signed and Sealed this

Twentieth Day of November, 2001

*Attest:*

*Attesting Officer*

NICHOLAS P. GODICI
*Acting Director of the United States Patent and Trademark Office*